United States Patent
Wang et al.

(10) Patent No.: US 11,162,738 B2
(45) Date of Patent: Nov. 2, 2021

(54) GRAVITY LOOP THERMOSYPHON AND HEAT DISSIPATION DEVICE COMPRISING THE SAME

(71) Applicant: VAST GLORY ELECTRONIC & HARDWARE & PLASTIC (HUI ZHOU) LTD, Hui Zhou (CN)

(72) Inventors: Xuemei Wang, Hui Zhou (CN); Leilei Liu, Hui Zhou (CN)

(73) Assignee: VAST GLORY ELECTRONIC & HARDWARE & PLASTIC (HUI ZHOU) LTD, Huizhou (CN)

( * ) Notice: Subject to any disclaimer, the term of this patent is extended or adjusted under 35 U.S.C. 154(b) by 282 days.

(21) Appl. No.: 16/594,609

(22) Filed: Oct. 7, 2019

(65) Prior Publication Data

US 2020/0363134 A1  Nov. 19, 2020

(30) Foreign Application Priority Data

May 13, 2019  (CN) .......................... 201910394008.3

(51) Int. Cl.
 *F28D 15/00* (2006.01)
 *F28D 15/02* (2006.01)
 *F04B 19/24* (2006.01)

(52) U.S. Cl.
 CPC .......... *F28D 15/0266* (2013.01); *F04B 19/24* (2013.01); *F28F 2215/08* (2013.01)

(58) Field of Classification Search
 CPC .... F28D 15/0266; F04B 19/24; F28F 2215/08
 (Continued)

(56) References Cited

U.S. PATENT DOCUMENTS 4,073,340 A * 2/1978 Parker ...................... F28D 9/00
  165/166
4,688,631 A * 8/1987 Peze ..................... F28D 9/0037
  165/166

(Continued)

FOREIGN PATENT DOCUMENTS

CN  201344752  11/2009
CN  101901036  12/2010
(Continued)

OTHER PUBLICATIONS

English abstracts for CN201344752Y, CN101901036A, CN109073312A, TW381687, and TWM574262, Total of 5 pages.

*Primary Examiner* — Claire E Rojohn, III
(74) *Attorney, Agent, or Firm* — Tracy M Heims; Apex Juris, pllc.

(57) ABSTRACT

A heat dissipation device has a frame assembly, a gravity loop thermosyphon, and a dissipating fin assembly. The gravity loop thermosyphon has a heat exchanger, a condenser, two bendable tubes, and working fluid. One end of each bendable tube communicates with the heat exchanger and another end of each bendable tube communicates with the condenser and thus the working fluid may circulate therein. After the bendable tubes are bent, the condenser can be moved to an appropriate location or tilted to an appropriate angle according to the environment, and then the location and the angle are fixed via the frame assembly so the gravity loop thermosyphon can adapt for different dissipation assemblies.

13 Claims, 13 Drawing Sheets

(58) Field of Classification Search
USPC .................................................. 165/104.21
See application file for complete search history.

(56) References Cited

U.S. PATENT DOCUMENTS

| | | | | |
|---|---|---|---|---|
| 10,876,794 | B2* | 12/2020 | Bergh | F28D 9/0006 |
| 2003/0133856 | A1* | 7/2003 | Le | B01J 19/24 |
| | | | | 422/206 |
| 2003/0214787 | A1* | 11/2003 | Liu | H01L 23/4006 |
| | | | | 361/704 |
| 2005/0016719 | A1* | 1/2005 | Blomgren | F28F 3/046 |
| | | | | 165/165 |
| 2006/0144052 | A1* | 7/2006 | Callas | F28F 3/046 |
| | | | | 62/3.7 |
| 2006/0289152 | A1* | 12/2006 | Leuschner | F28F 1/126 |
| | | | | 165/152 |
| 2007/0044946 | A1* | 3/2007 | Mehendale | F28F 3/044 |
| | | | | 165/153 |
| 2009/0133861 | A1* | 5/2009 | Kim | F24H 1/48 |
| | | | | 165/140 |
| 2009/0151917 | A1* | 6/2009 | Meschke | F28D 9/005 |
| | | | | 165/168 |
| 2010/0065262 | A1* | 3/2010 | Platt | F28D 9/005 |
| | | | | 165/164 |
| 2010/0218927 | A1* | 9/2010 | Cooper | F28D 19/042 |
| | | | | 165/185 |
| 2010/0263843 | A1* | 10/2010 | Chang | F28F 3/046 |
| | | | | 165/133 |
| 2011/0024097 | A1* | 2/2011 | Christensen | F28F 3/046 |
| | | | | 165/166 |
| 2011/0042035 | A1* | 2/2011 | Seebald | F28D 19/044 |
| | | | | 165/8 |
| 2011/0088882 | A1* | 4/2011 | Persson | F28D 9/005 |
| | | | | 165/167 |
| 2011/0108258 | A1* | 5/2011 | Magnier-Cathenod | |
| | | | | F28F 3/046 |
| | | | | 165/167 |
| 2011/0290462 | A1* | 12/2011 | Andersson | F28D 9/005 |
| | | | | 165/170 |
| 2011/0308779 | A1* | 12/2011 | Andersson | F28D 9/005 |
| | | | | 165/170 |
| 2012/0000628 | A1* | 1/2012 | Weber | F28D 15/02 |
| | | | | 165/96 |
| 2012/0305217 | A1* | 12/2012 | Cowburn | F28D 19/044 |
| | | | | 165/67 |
| 2012/0325434 | A1* | 12/2012 | Blomgren | F28F 3/046 |
| | | | | 165/104.19 |
| 2013/0087317 | A1* | 4/2013 | Papoulis | F28F 3/044 |
| | | | | 165/177 |
| 2013/0113126 | A1* | 5/2013 | Mockry | F28C 1/16 |
| | | | | 261/112.1 |
| 2013/0113127 | A1* | 5/2013 | Yang | F28F 9/0075 |
| | | | | 261/112.1 |
| 2013/0126135 | A1* | 5/2013 | Romlund | F28F 3/046 |
| | | | | 165/133 |
| 2013/0180699 | A1* | 7/2013 | Dahlberg | F28D 9/0031 |
| | | | | 165/185 |
| 2013/0209322 | A1* | 8/2013 | Gaiser | F28D 20/02 |
| | | | | 422/175 |
| 2013/0233518 | A1* | 9/2013 | Liu | F28D 15/04 |
| | | | | 165/104.26 |
| 2014/0138059 | A1* | 5/2014 | Ambrose | B64G 1/506 |
| | | | | 165/104.26 |
| 2014/0158328 | A1* | 6/2014 | Persson | F28F 3/042 |
| | | | | 165/109.1 |
| 2016/0245593 | A1* | 8/2016 | Rice | F28D 15/0275 |
| 2017/0265329 | A1* | 9/2017 | Dixit | H01L 29/861 |
| 2017/0307301 | A1* | 10/2017 | Sorensen | F28D 15/025 |
| 2017/0328646 | A1* | 11/2017 | Zhou | F28D 15/0275 |
| 2017/0336114 | A1* | 11/2017 | Lee | F25D 21/08 |
| 2018/0292145 | A1* | 10/2018 | Sun | F28D 15/0266 |
| 2018/0363991 | A1* | 12/2018 | Cukurel | F01D 5/00 |
| 2019/0170457 | A1* | 6/2019 | Zhai | H05K 7/20809 |
| 2020/0018555 | A1* | 1/2020 | Lin | F28D 15/04 |
| 2020/0049420 | A1* | 2/2020 | Liu | F28D 15/046 |
| 2020/0080763 | A1* | 3/2020 | Kang | F28D 15/0275 |
| 2020/0200484 | A1* | 6/2020 | Zhou | F28F 3/12 |
| 2020/0217595 | A1* | 7/2020 | Wu | F28D 15/04 |
| 2020/0284523 | A1* | 9/2020 | Wan | F28D 1/0333 |
| 2020/0355443 | A1* | 11/2020 | Tochigi | F28D 15/0275 |
| 2020/0363134 | A1* | 11/2020 | Wang | F28D 15/0241 |
| 2020/0386493 | A1* | 12/2020 | Noren | F28F 3/025 |

FOREIGN PATENT DOCUMENTS

| | | |
|---|---|---|
| CN | 109073312 | 12/2018 |
| TW | 381687 | 2/2000 |
| TW | M574262 | 2/2021 |

* cited by examiner

GRAVITY LOOP THERMOSYPHON AND HEAT DISSIPATION DEVICE COMPRISING THE SAME

CROSS-REFERENCE TO RELATED APPLICATIONS

This application is based upon and claims priority under 35 U.S.C. 119 from China Patent Application No. 201910394008.3 filed on May 13, 2019, which is hereby specifically incorporated herein by this reference thereto.

BACKGROUND OF THE INVENTION

1. Field of the Invention

The present invention relates to a heat dissipating component and a heat dissipation device.

2. Description of the Prior Arts

Heat pipes are one of the commonly used heat dissipating components because of its outstanding heat dissipating efficiency. The main principle is that: the heat pipe comprises a shell made of a heat-conductive material and a cavity is formed in the shell; the cavity forms two passages therein, both of the two passages extend from one end of the cavity to another end of the cavity, and the two passages communicate with each other at the two ends of the cavity. After a volatile fluid is fed into the cavity, the cavity is vacuumed and then sealed. With such structure, the fluid can flow in the two passages. Precisely, flowing directions of the fluid in the two passages are different. At a first end of the cavity, the fluid is heated and thereby vaporized, and then flows to a second end of the cavity via one of the passages. At the second end, the vaporized fluid is cooled and thereby condensed, and then flows back to the first end. Therefore, the fluid circulates in the cavity, which provides outstanding heat dissipating efficiency.

As related technologies become more sophisticated, many types of the heat pipes are invented. One of the types of the heat pipes is a loop thermosyphon, which includes a tube to connect to a condenser and thereby further improves heat dissipating efficiency. However, with structures of the heat pipes becoming more complicated, devices only can be mounted with a specific type of the heat pipes. In other words, different heat sources need different heat pipes, so the costs of research and design and storage are increased.

To overcome the shortcomings, the present invention provides a gravity loop thermosyphon and a gravity loop thermosyphon to mitigate or obviate the aforementioned problems.

SUMMARY OF THE INVENTION

The main objective of the present invention is to provide a gravity loop thermosyphon and a heat dissipation device that include a bendable tube, so the gravity loop thermosyphon and heat dissipation device can be bent to be adapted to different devices or circumstances.

The gravity loop thermosyphon has a heat exchanger, at least one condenser, at least one first bendable tube, at least one second bendable tube, and a working fluid. The heat exchanger includes an outlet portion and an inlet portion. Each one of the at least one condenser includes an exit and an entry. One end of each one of the at least one first bendable tube communicates with the outlet portion of the heat exchanger and another end of said first bendable tube communicates with the entry of the at least one condenser. One end of each one of the at least one second bendable tube communicates with the inlet portion of the heat exchanger and another end of said second bendable tube communicates with the exit of the at least one condenser. The working fluid circulates in the heat exchanger, the at least one condenser, the at least one first bendable tube, and the at least one second bendable tube.

The heat dissipation device has a frame assembly, the aforesaid gravity loop thermosiphon, and at least one dissipating fin assembly. The gravity loop thermosyphon is securely mounted on the frame assembly. The at least one dissipating fin assembly abuts the at least one condenser of the gravity loop thermosiphon. The at least one dissipating fin assembly is fixed on the gravity loop thermosyphon via the frame assembly.

With the aforesaid structures, after the first bendable tubes and the second bendable tubes are bent, each one of the condensers of the gravity loop thermosyphon can be moved to an appropriate location or tilted to an appropriate angle according to the environment, and then the location and the angle are fixed via the frame assembly so the gravity loop thermosyphon can adapt for different dissipation assemblies. Therefore, the manufacturer can assemble the aforementioned gravity loop thermosyphon with most of the devices and thereby the cost is decreased.

Other objectives, advantages and novel features of the invention will become more apparent from the following detailed description when taken in conjunction with the accompanying drawings.

DETAILED DESCRIPTION OF THE PREFERRED EMBODIMENTS

Please refer to FIGS. 1 to 4 first. A heat dissipation device in accordance with the present invention is provided and comprises a gravity loop thermosyphon 10, a frame assembly 20, and at least one dissipating fin assembly 30.

The gravity loop thermosyphon 10 is securely mounted on the frame assembly 20 and comprises a heat exchanger 11, at least one condenser 12, at least one first bendable tube 131, at least one second bendable tube 132, and a working fluid. The working fluid can circulate in the heat exchanger 11, the at least one condenser 12, the at least one first bendable tube 131, and the at least one second bendable tube 132.

An amount of the at least one condenser 12, an amount of the at least one first bendable tube 131, and an amount of the at least one second bendable tube 132 are the same; in this embodiment, the amounts are two. Each one of the first bendable tubes 131 and second bendable tubes 132 is a metal hose, and thus the heat exchanger 11, the condensers 12, the first bendable tubes 131, and the second bendable tubes 132 can be fixed through high-frequency welding, which prevents the welding portion thereof from being broken. Therefore, the gravity loop thermosyphon 10 is sealed tighter. Precisely, with high-frequency welding rather than conventional furnace brazing, the remaining portions near the welding portions would not undergo high temperature and therefore would not embrittle and thereby the durability of the gravity loop thermosyphon 10 is improved.

Figure 4:
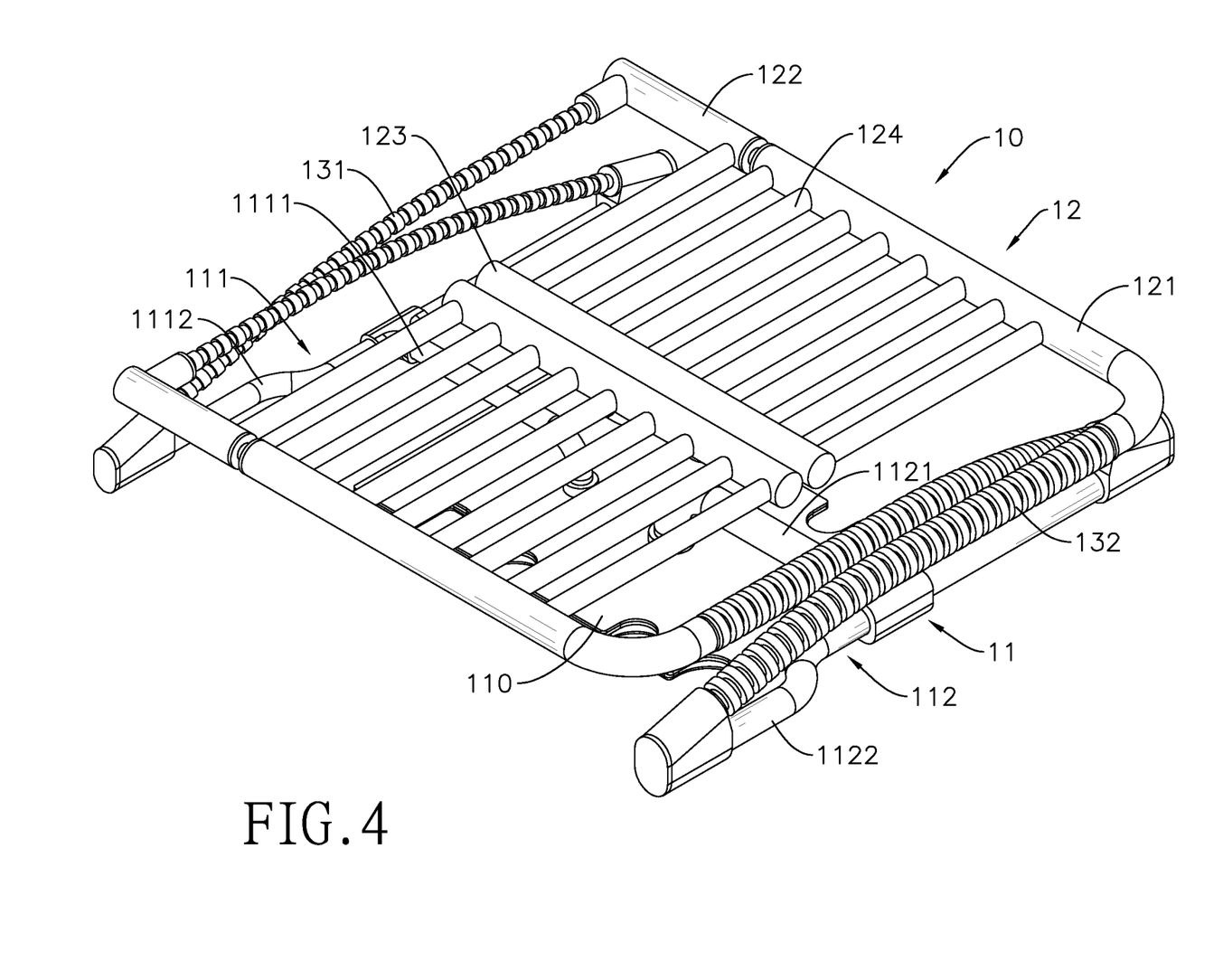
FIG. 4 is a perspective view of a gravity loop thermosyphon of the heat dissipation device in FIG. 1.
Figure 5:
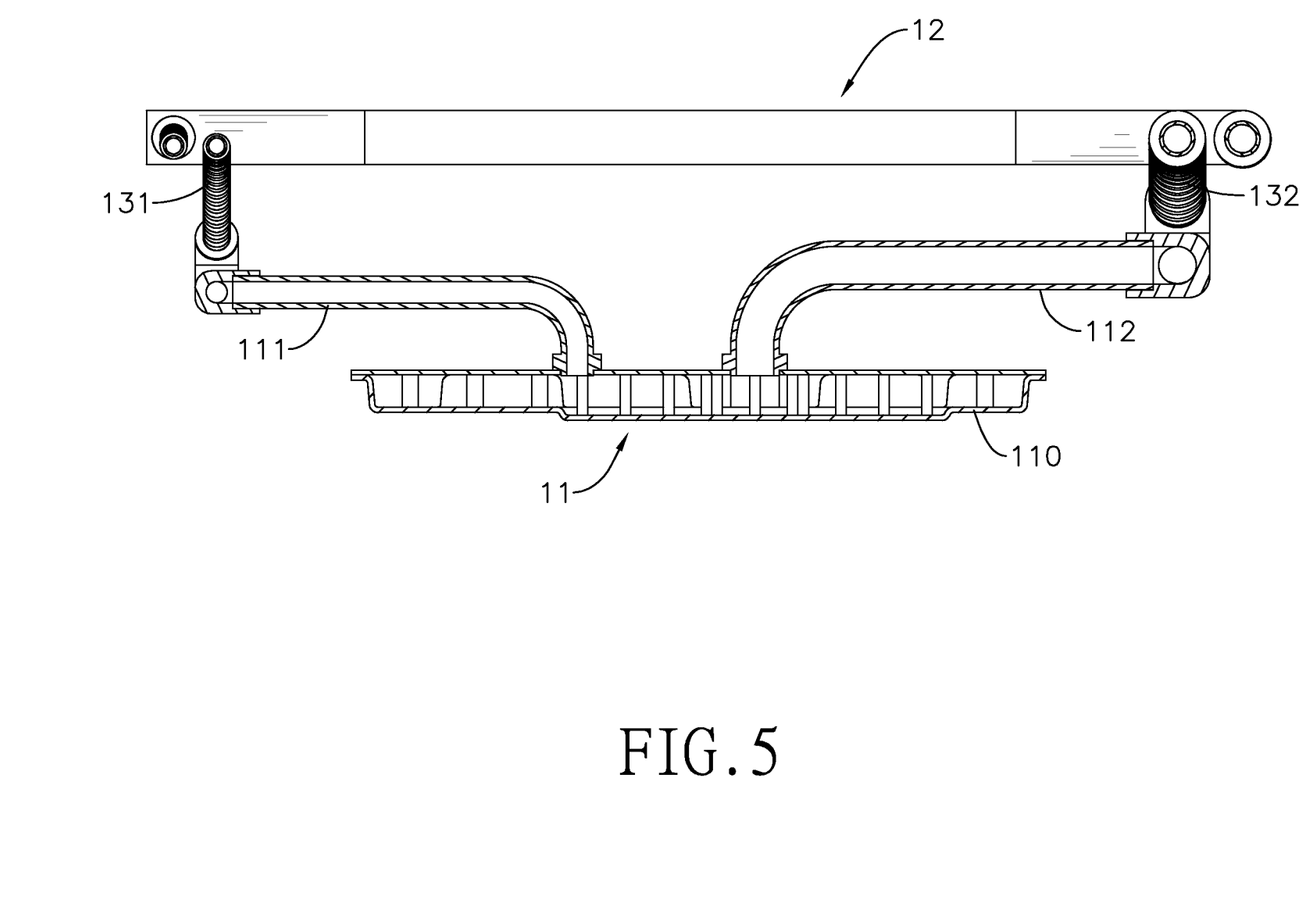
FIG. 5 is a sectional view of the gravity loop thermosyphon in FIG. 4.

Then please refer to FIGS. 4 and 5. The heat exchanger 11 is configured to downward attach to a heat source (not shown in the drawings) and includes an inlet portion 111 and an outlet portion 112. The inlet portion 111 and the outlet portion 112 are configured for the working fluid to pass through. Precisely, the heat exchanger 11 comprises a vaporizing chamber 110, a first main pipe 1111, and a second main pipe 1121; in this embodiment, the heat exchanger 11 further comprises two first branch pipes 1112 and two second branch pipes 1122, but it is not limited thereto. An amount of the first branch pipes 1112 and an amount of the second branch pipes 1122 are equal to the amount of the at least one condenser 12.

Figure 6:
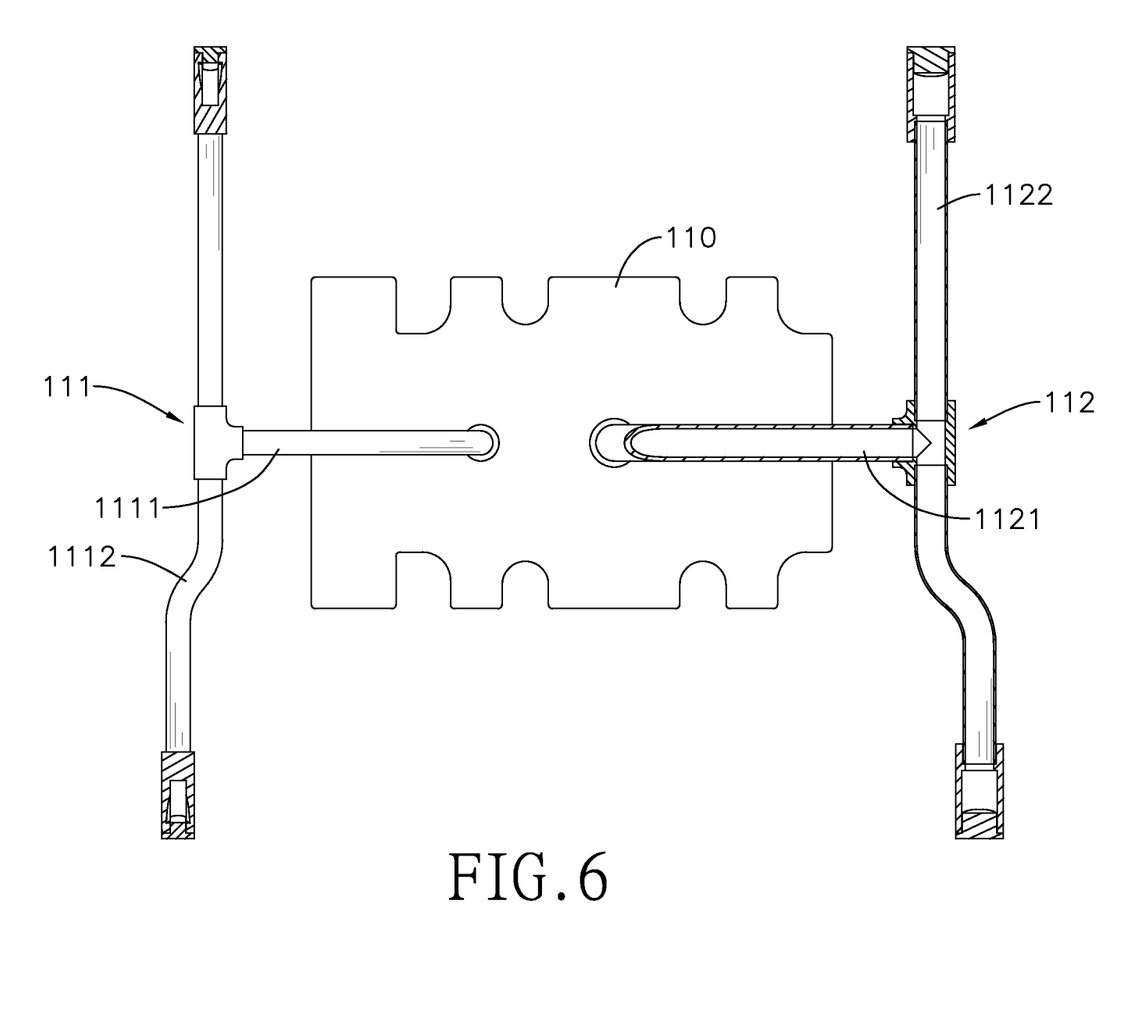
FIG. 6 is a sectional view of an inlet portion and an outlet portion of the gravity loop thermosyphon in FIG. 4.
Figure 8:
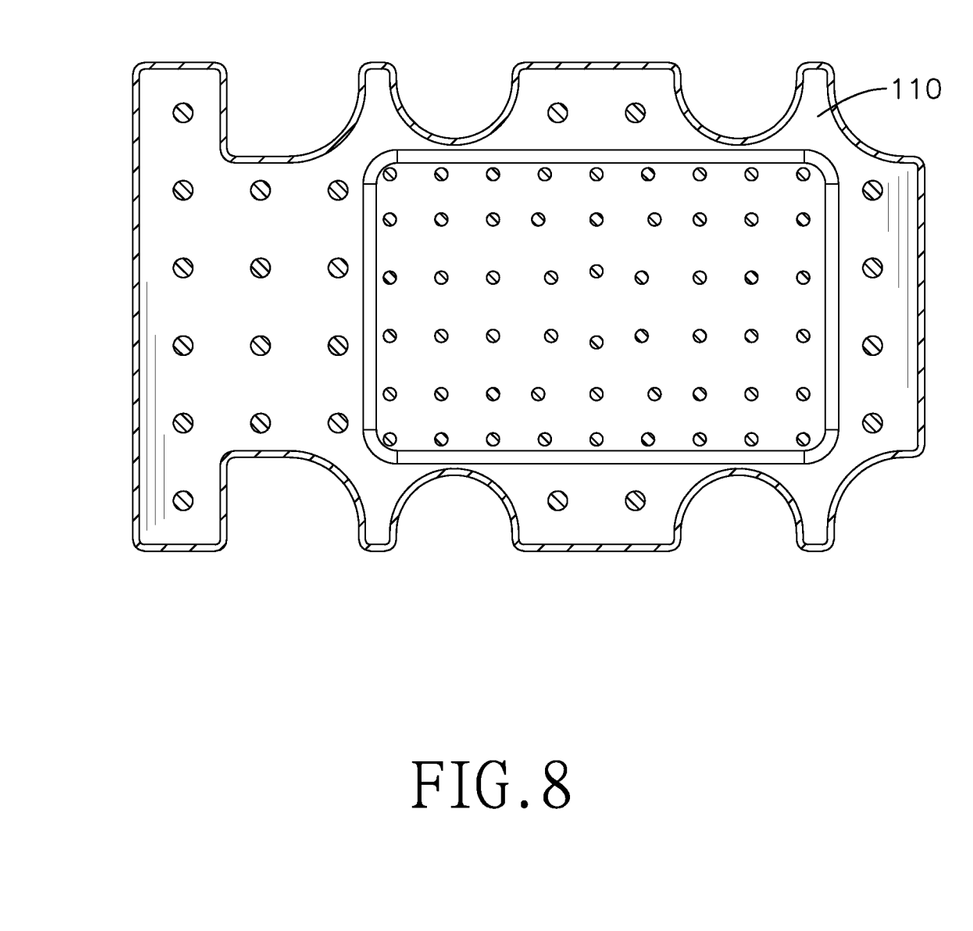
FIG. 8 is a sectional view of a heat exchanger of the gravity loop thermosyphon in FIG. 4.

Then please refer to FIGS. 5, 6, and 8. The vaporizing chamber 110 forms an inner space, and capillary structures are mounted on inner walls of the inner space. Therefore, with the capillary structures, the working fluid may separate on the inner walls of the inner space of the vaporizing chamber 110, which improves the heat dissipation efficiency. The inlet portion 111 and the outlet portion 112 are securely mounted on the vaporizing chamber 110 and communicate with the inner space. Precisely, the inlet portion 111 includes the aforesaid first main pipe 1111 and the aforesaid first branch pipes 1112. One end of the first main pipe 1111 communicates with the inner space of the vaporizing chamber 110. One end of each one of the first branch pipes 1112 communicates with the first main pipe 1111 and another end of each one of the first branch pipes 1112 communicates with a respective one of the first bendable tubes 131. In other words, both of the two first bendable tubes communicate with the first main pipe 1111 via the first branch pipes 1112.

Similarly, the outlet portion 112 includes the aforesaid second main pipe 1121 and the aforesaid second branch pipes 1122. One end of the second main pipe 1121 communicates with the inner space of the vaporizing chamber 110. One end of each one of the second branch pipes 1122 communicates with the second main pipe 1121 and another end of each one of the second branch pipes 1122 communicates with a respective one of the second bendable tubes 132. In other words, both of the two second bendable tubes 132 communicates with the second main pipe 1121 via the second branch pipes 1122.

Figure 7:
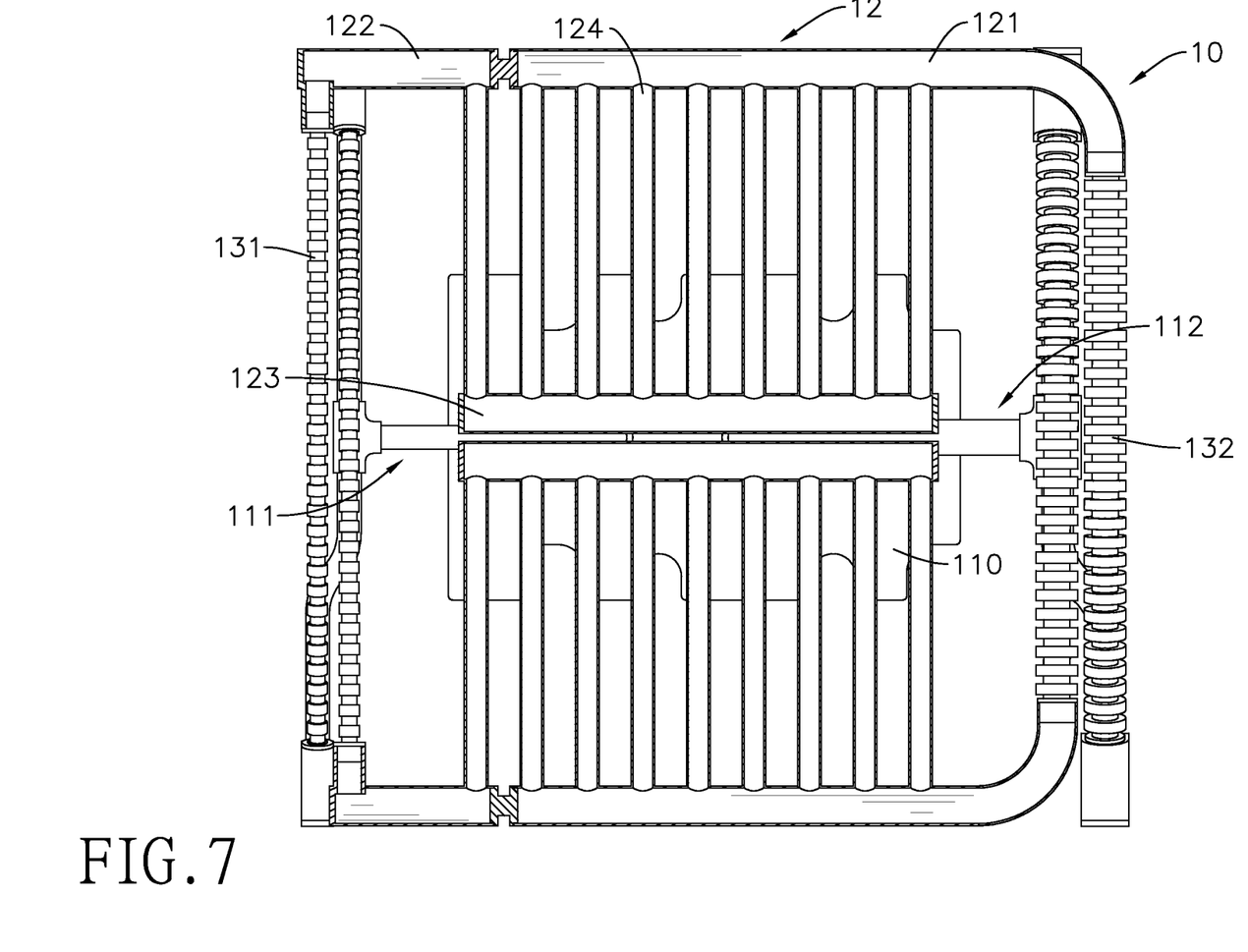
FIG. 7 is a sectional view of condensers of the gravity loop thermosyphon in FIG. 4.

Then please refer to FIGS. 4 and 7. In this embodiment, each one of condensers 12 communicates with a respective one of the first bendable tubes 131 and a respective one of the second bendable tubes 132. Therefore, the two condensers 12 form two circulating loops. Each one of the condensers 12 includes an exit and an entry. One end of each one of the first bendable tubes 131 communicates with the exit of a respective one of the condensers 12, and another end of each one of the first bendable tubes 131 communicates with the inlet portion 111 of the heat exchanger 11; one end of each one of the second bendable tubes 132 communicates with the entry of a respective one of the condensers 12 and another end of each one of the second bendable tubes 132 communicates with the outlet portion 112 of the heat exchanger 11. Thus, one of the circulating loops for the working fluid is formed.

Each one of the condensers 12 comprises a first tube 121, a second tube 122, and a plurality of channels 124. Besides, each condenser 12 may selectively comprise a third tube 123. The entry of each condenser 12 is formed on the corresponding first tube 121; in this embodiment, the entry is formed at an end of the corresponding first tube 121. The exit of each condenser 12 is formed on the corresponding second tube 122; in this embodiment, the exit is formed at an end of the corresponding second tube 122. In this embodiment, the first tube 121 and the second tube 122 of the same condenser 12 are arranged coaxially. The entry is formed on an end of the first tube 121 that is away from the second tube 122. The exit is formed on an end of the second tube 122 that is away from the first tube 121.

In this embodiment, in each condenser 12, the third tube 123 parallels with the first tube 121 and the second tube 122, but it is not limited thereto. In at least one of the condensers 12, two ends of one of the channels 124 respectively communicate with the second tube 122 and the third tube 123 and two ends of each one of the remaining channels 124 respectively communicate with the first tube 121 and the third tube 123. However, it is not limited thereto. For example, two ends of one of the channels 124 may respectively communicate with the first tube 121 and the third tube 123 and two ends of each one of the remaining channels 124 may respectively communicate with the second tube 122 and the third tube 123. With such structure, in the same condenser 12, the first tube 121 and the second tube 122 communicate with each other via the channels 124. In this embodiment, all of the channels 124 of the same condenser 12 parallel with each other but are perpendicular to the first tube 121, the second tube 122, and the third tube 123. However, the arrangement is not limited thereto.

With the condensers 12 connected to the first bendable tubes 131 and the second bendable tubes 132, locations and angles of the condensers 12 with respect to the heat exchanger 11 can be adjusted. However, the locations of the condensers 12 should be higher than that of the heat exchanger 11 to maintain the circulation of the working fluid.

Figure 1:
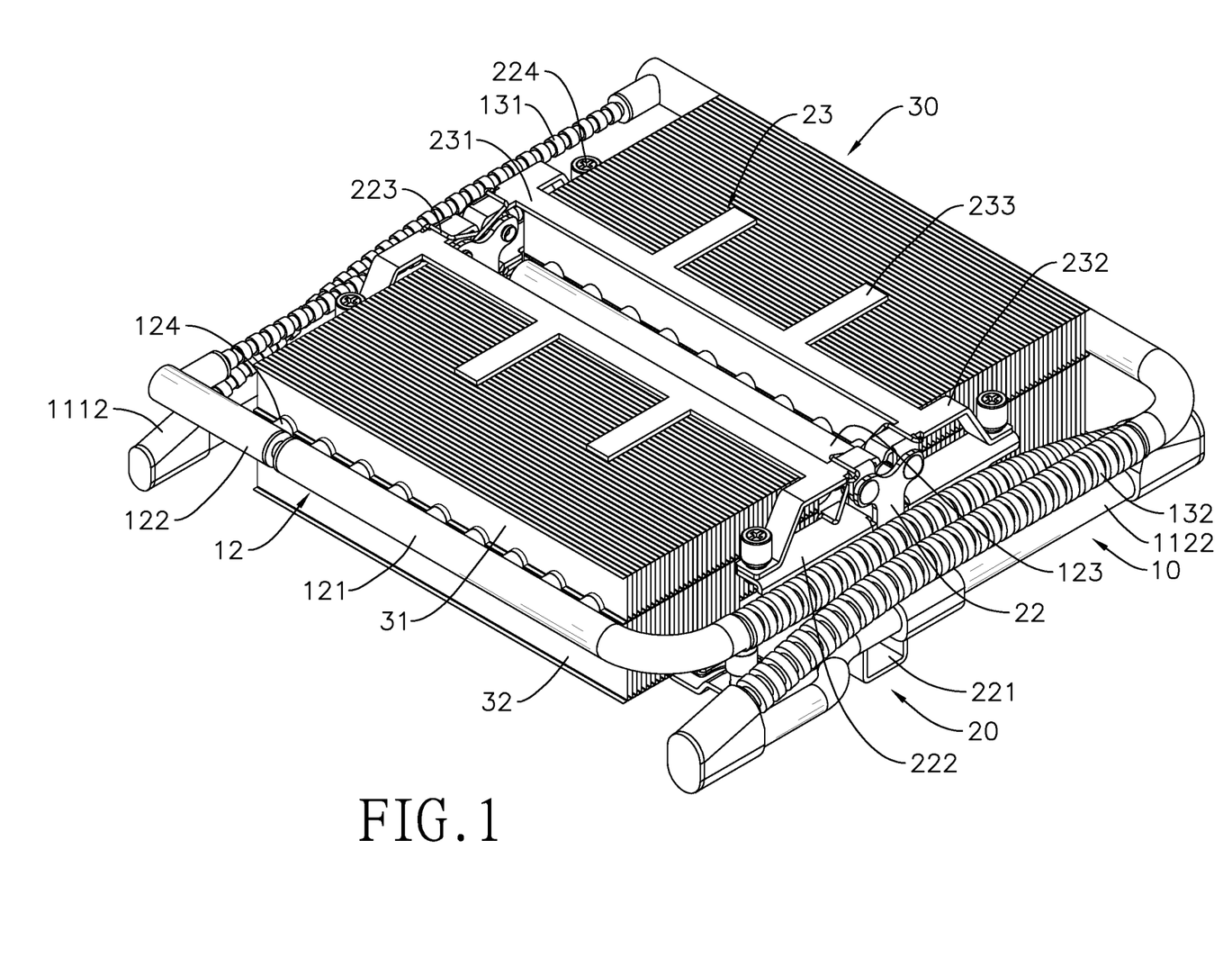
FIG. 1 is a perspective view of a heat dissipation device in accordance with the present invention.
Figure 2:
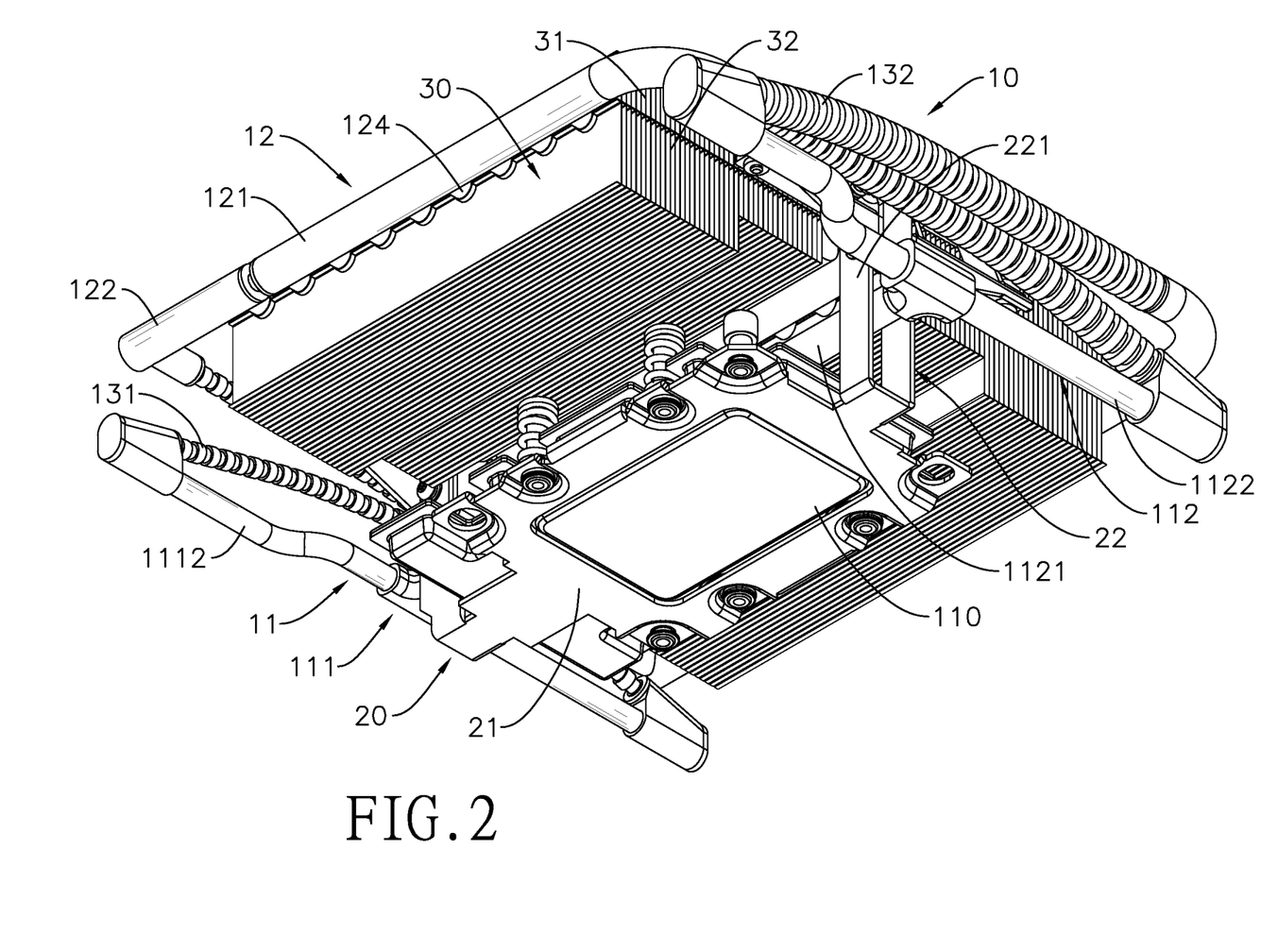
FIG. 2 is another perspective view of the heat dissipation device in FIG. 1.
Figure 3:
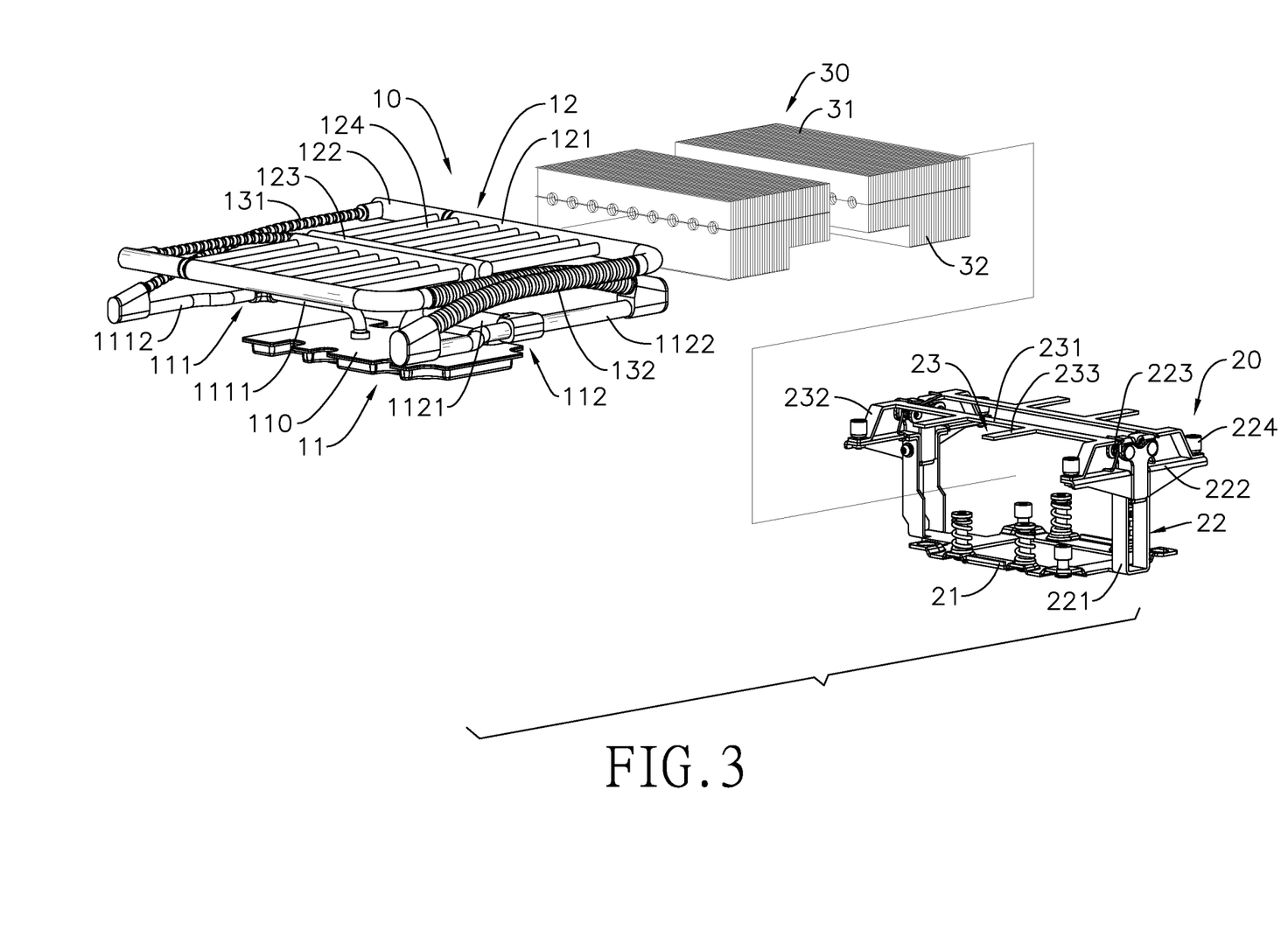
FIG. 3 is an exploded view of the heat dissipation device in FIG. 1.

Please refer to FIGS. 1 to 3. The frame assembly 20 may comprise a base 21, two arms 22, and at least one abutting component 23. The heat exchanger 11 of the gravity loop thermosyphon 10 is mounted on the base 21. In this embodiment, the base 21 may be a rim configured to enclose the heat exchanger 11 but a bottom surface of the heat exchanger 11 is still capable of contacting the heat source. The two arms 22 are respectively and securely mounted on two ends of the base 21 and respectively located on two lateral sides of the gravity loop thermosyphon 10, but the two arms may or may not contact the gravity loop thermosyphon 10.

Figure 9:
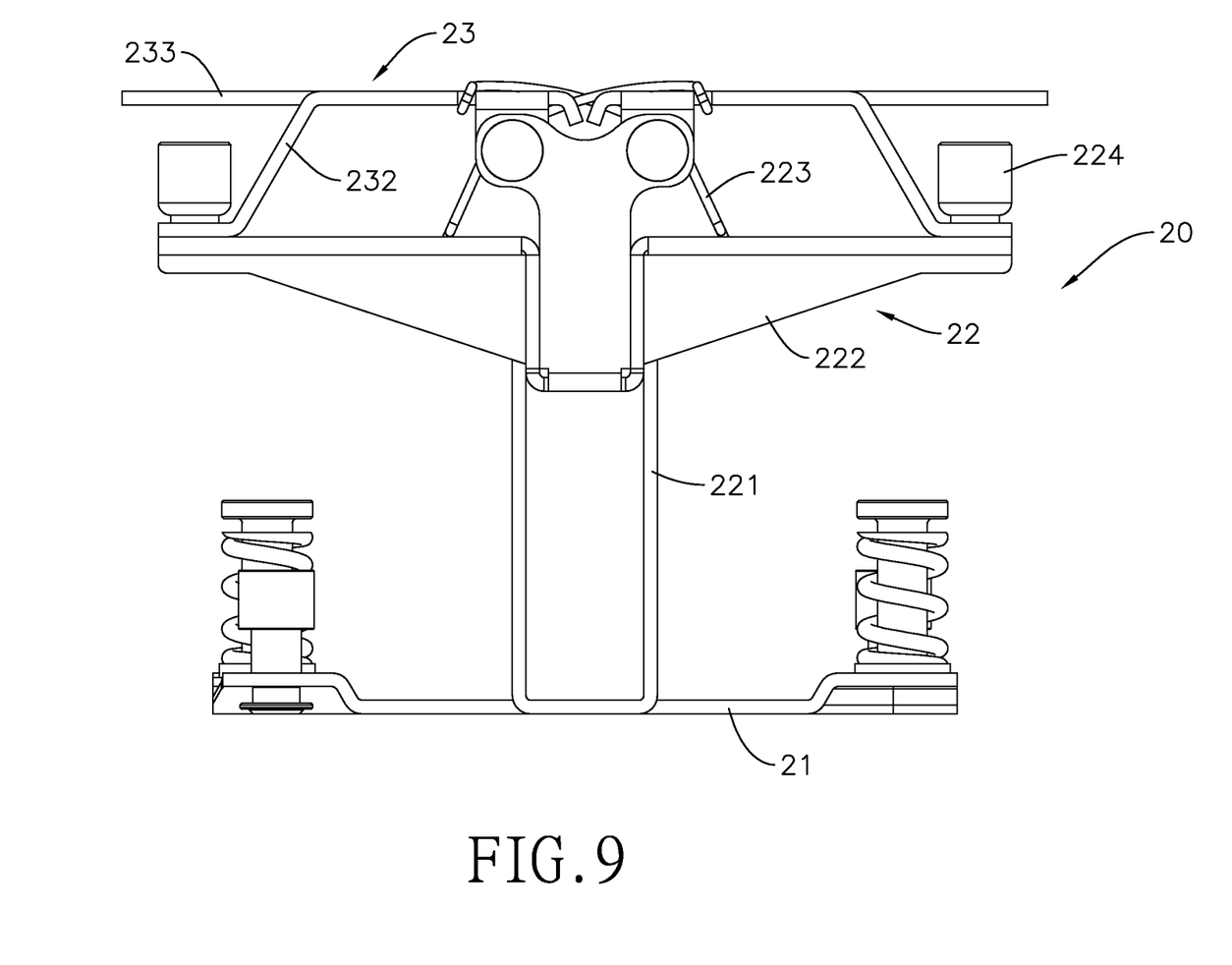
FIG. 9 is a front view of an arm of a frame assembly of the heat dissipation device in FIG. 1.

Then please refer to FIG. 9, too. In this embodiment, each one of the arms 22 forms a vertical extension portion 221 and two lateral extension portions 222. The vertical extension portion 221 extends upward and downward. A bottom end of the vertical extension portion 221 is securely mounted on the base 21. The two lateral extension portions 222 are securely mounted on a top end of the vertical extension portion 221 and extend toward opposite directions to each other laterally from the vertical extension portion 221. In other words, each one of the arms 22 may be T shaped or Y shaped.

In this embodiment, an amount of the at least one abutting component 23 may be equal to that of the condensers 12 of the gravity loop thermosyphon 10, but it is not limited thereto. Two ends of each one of the at least one abutting component 23 are respectively and tiltably connected to the two arms 22, and each one of the at least one abutting component 23 abuts the at least one dissipating fin assembly 30. In another embodiment, the abutting component 23 may not be capable of being tilted. In this embodiment, to allow the abutting component 23 to be tiltable, the frame assembly 20 may further comprise a plurality of resilient components 223 and a plurality of fixing components 224.

Figure 10:
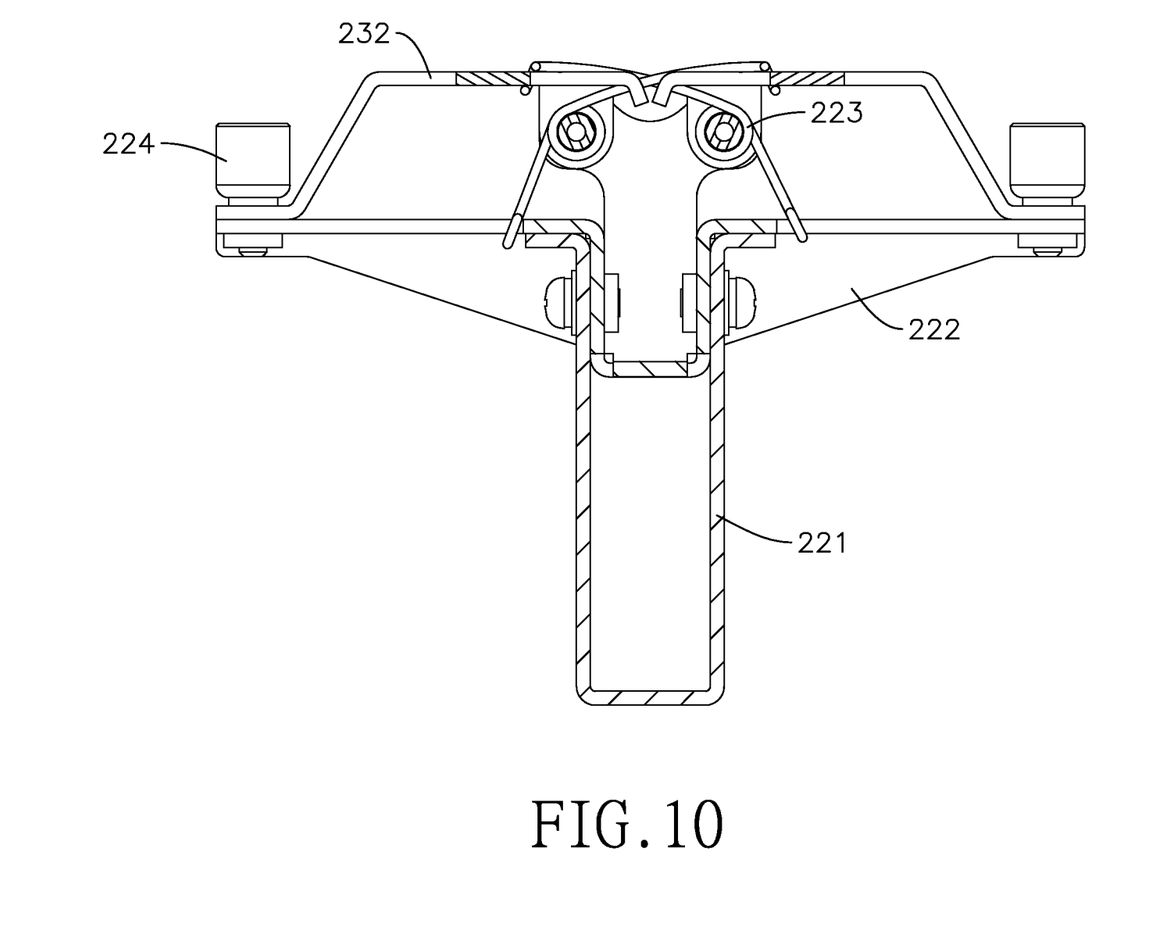
FIG. 10 is a sectional view of the arm in FIG. 1 showing abutting components of the frame assembly are closed.
Figure 11:
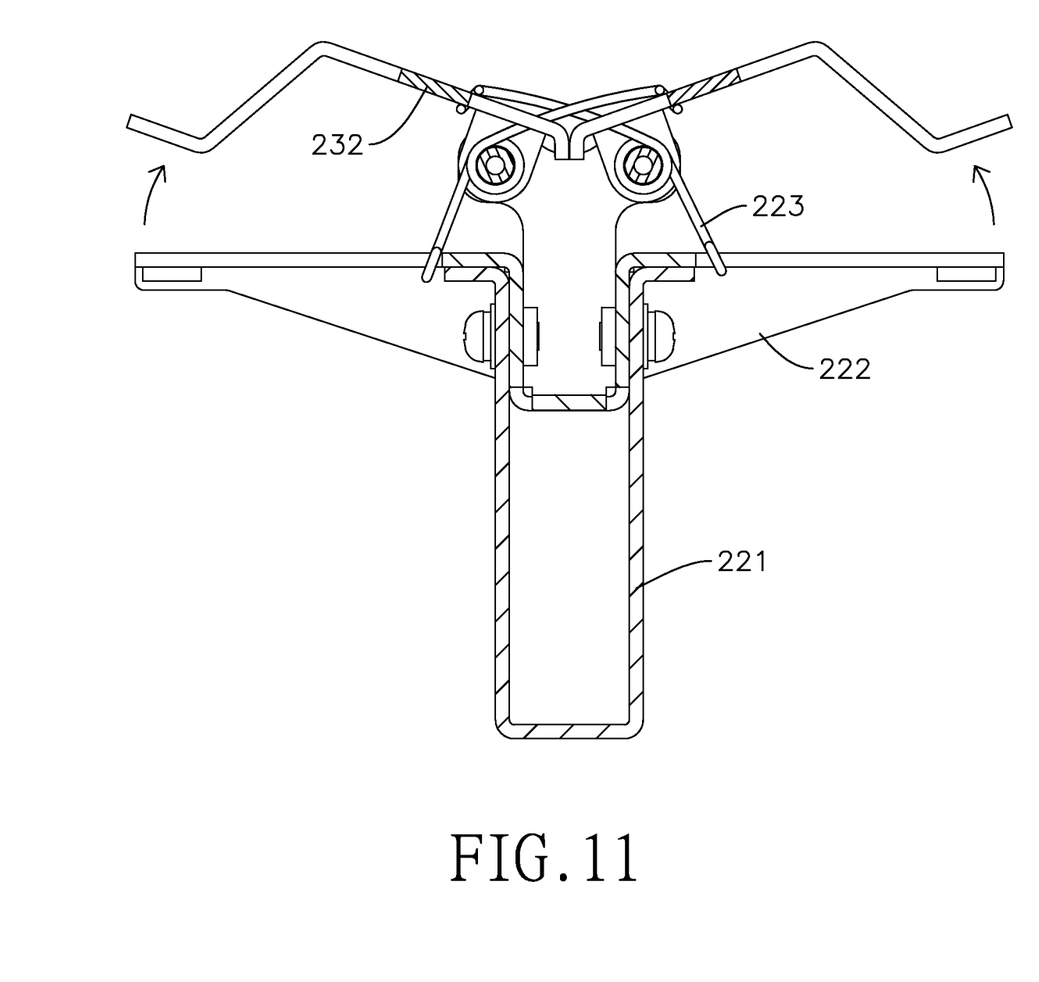
FIG. 11 is another sectional view of the arm in FIG. 1 showing abutting components are open.

Then please also refer to FIGS. 10 and 11. Precisely, each one of the abutting components 23 may comprise an axial portion 231, two fixed portions 232, and at least one abutting portion 233. Two ends of the axial portion 231 are respectively and tiltably connected to the two arms 22, and one end of each resilient component 223 is connected to a respective one of the arms 22 and another end of each resilient component 223 is connected to one end of the axial portion 231. One end of each fixed portion 232 is securely mounted on the axial portion 231 and another end of each fixed portion 232 is fixed on an outer end of a respective one of lateral extension portions 222 of the arms 22. One end of the at least one abutting portion 233 is securely mounted on the axial portion 231, located between the two fixed portions 232 of the same abutting component 23, and configured to press the at least one dissipating fin assembly 30.

The resilient components 223 are configured to tilt the connected abutting components 23 so the connected abutting components 23 tend to tilt away from the at least one dissipating fin assembly 30, Precisely, the abutting portions 233 of the abutting component 23 would tilt away from the at least one dissipating fin assembly 30. However, if the abutting components 23 are tilted until the abutting portions 233 press the at least one dissipating fin assembly 30, and then the fixing components 224 are securely mounted on the arms 22 and clamp the fixed portions 232 of the abutting components 23 with the arms 22, the abutting portions 233 of the abutting components 23 would downward press the at least one dissipating fin assembly 30 continuously, and the fixing components 224 would prevent the clamped abutting components 23 from being tilted away from the at least one dissipating fin assembly 30. With the resilient components 223 and the fixing components 224, the manufacturer may fix the condensers 12 at appropriate locations and angles easily and fix the at least one dissipating fin assembly 30 on the gravity loop thermosyphon 10 and the frame assembly 20.

An amount of the at least one dissipating fin assembly 30 may be equal to that of the condensers 12, so the heat dissipation device has two dissipation assemblies 30 in this embodiment. Each one of the dissipation assemblies 30 is securely mounted on the frame assembly 20 and the respective one of the condensers 12 of the gravity loop thermosyphon 10. In this embodiment, a bottom portion of each dissipating fin assembly 30 contacts the heat exchanger 11 and a top portion of each dissipating fin assembly 30 is pressed down by a respective one of the abutting components 23. Precisely, each one of the dissipation assemblies 30 comprises a first fin assembly 31 and a second fin assembly 32. The first fin assembly 31 is mounted on a bottom side of a respective one of the condensers 12. Therefore, a bottom portion of the first fin assembly 31 contacts the heat exchanger 11 and a top portion of the first fin assembly 31 contacts said condenser 12. The second fin assembly 32 is mounted on a top side of said condenser 12. Therefore, a bottom portion of the second fin assembly 32 contacts said condenser 12 and a top portion of the second fin assembly 32 is pressed down by a respective one of the abutting components 23. With such structure, the first fin assembly 31 and the second fin assembly 32 clamp one of the condensers 12. The first fin assembly 31 and the second fin assembly 32 may be fixed via welding or adhering, or may not be fixed together but only contact each other.

Figure 12:
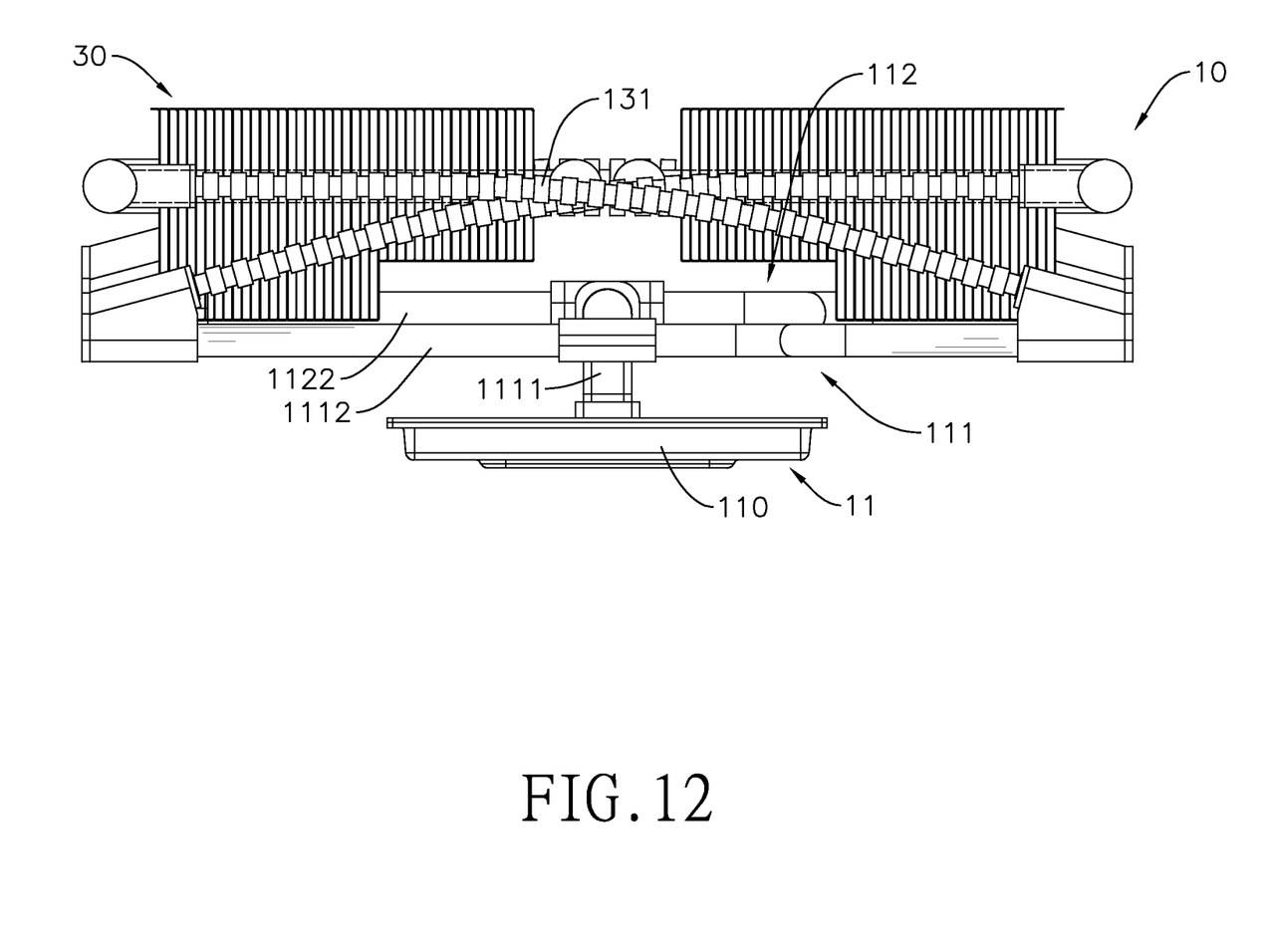
FIG. 12 is an operational schematic view showing the gravity loop thermosyphon fixed in a type of dissipating fin assembly.
Figure 13:
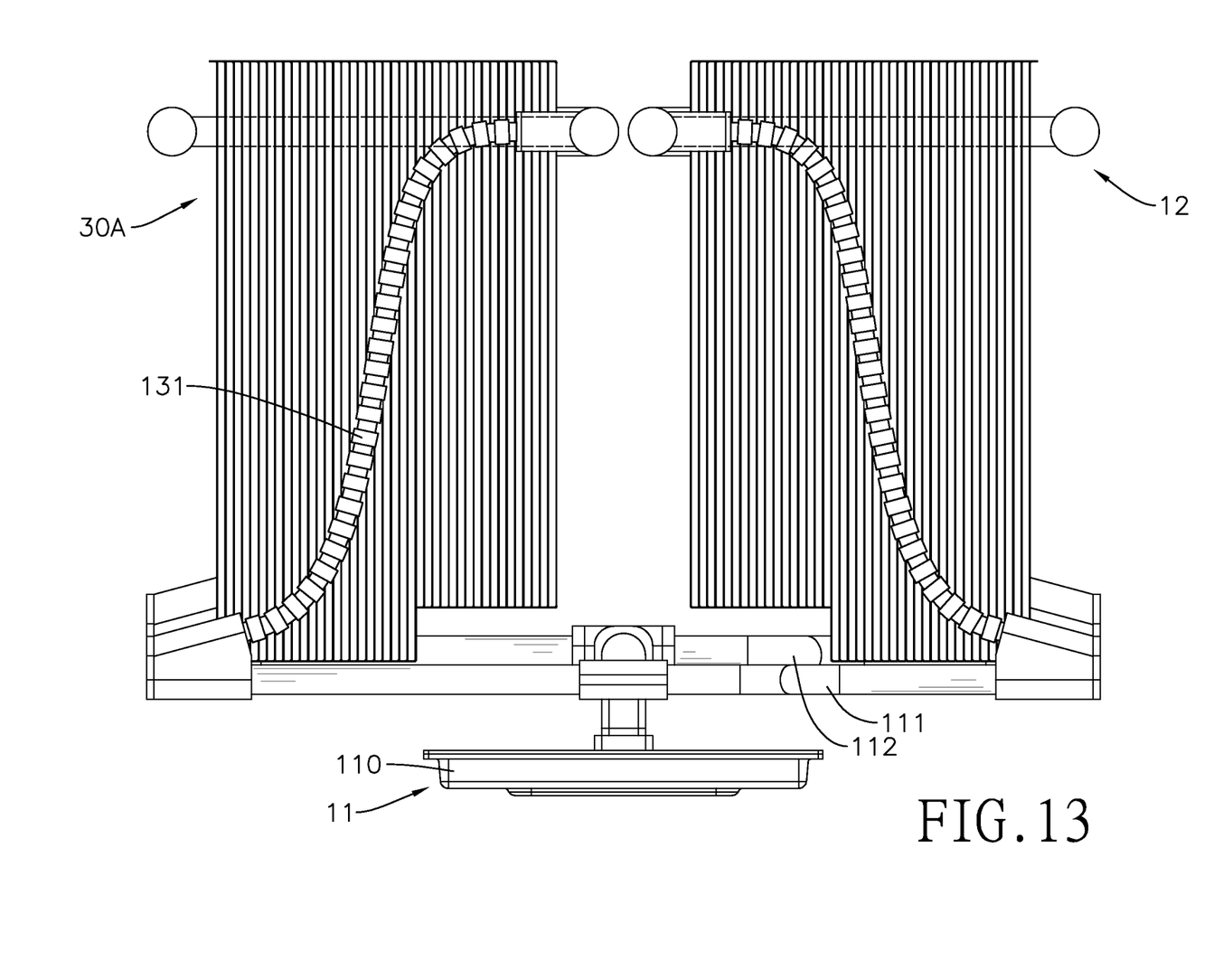
FIG. 13 is another operational schematic view showing the gravity loop thermosyphon fixed in another type of dissipating fin assembly.

Then please refer to FIGS. 12 and 13. With the aforesaid structures, after the first bendable tubes 131 and the second bendable tubes 132 are bent, each one of the condensers 12 of the gravity loop thermosyphon 10 can be moved to an appropriate location or tilted to an appropriate angle according to the environment, and then the location and the angle are fixed via the frame assembly 20 so the gravity loop thermosyphon 10 can adapt for different dissipation assemblies, e.g., the dissipating fin assembly 30 as shown in FIG. 12 or the dissipating fin assembly 30A as shown in FIG. 13. Therefore, the manufacturer can assemble the aforementioned gravity loop thermosyphon 10 with most devices and thereby the cost is decreased.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A gravity loop thermosyphon comprising:
    a heat exchanger including:
        an outlet portion and an inlet portion;
    at least one condenser, each one of the at least one condenser including
        an exit and an entry;
    at least one first bendable tube; one end of each one of the at least one first bendable tube communicating with the outlet portion of the heat exchanger and another end of said first bendable tube communicating with the entry of the at least one condenser; and
    at least one second bendable tube; one end of each one of the at least one second bendable tube communicating with the inlet portion of the heat exchanger and another end of said second bendable tube communicating with the exit of the at least one condenser; and
    a working fluid circulating in the heat exchanger, the at least one condenser, the at least one first bendable tube, and the at least one second bendable tube; and comprising two said condensers, two said first bendable tubes, two said second bendable tubes; wherein:

the heat exchanger comprises:

a vaporizing chamber;

the inlet portion of the heat exchanger is securely mounted on the vaporizing chamber and comprises:

a first main pipe; one end of the first main pipe communicating with the vaporizing chamber, and both of the two first bendable tubes communicating with the first main pipe;

the outlet portion of the heat exchanger is securely mounted on the vaporizing chamber and comprises:

a second main pipe; one end of the second main pipe communicating with the vaporizing chamber, and both of the two second bendable tubes communicating with the second main pipe; and each one of the two condensers communicating with a respective one of the two first bendable tubes and a respective one of the two second bendable tubes.

2. The gravity loop thermosyphon as claimed in claim 1, wherein each one of the at least one condenser comprises:

a first tube; the entry of the at least one condenser formed on the first tube;

a second tube; the exit of the at least one condenser formed on the second tube; and a plurality of channels; the first tube communicating with the second tube via the channels.

3. The gravity loop thermosyphon as claimed in claim 2, wherein each one of the at least one condenser further comprises:

a third tube; two ends of one of the channels respectively communicating with the second tube and the third tube and two ends of the remaining channels respectively communicating with the first tube and the third tube.

4. The gravity loop thermosyphon as claimed in claim 3, wherein, for each one of the at least one condenser:

the first tube and the second tube are arranged coaxially and the third tube is parallel with the first tube and the second tube;

the entry is formed on an end, away from the second tube, of the first tube; and the exit is formed on an end, away from the first tube, of the second tube.

5. The gravity loop thermosyphon as claimed in claim 1, wherein:

the inlet portion of the heat exchanger further comprises:

two first branch pipes; one end of each one of the first branch pipes communicating with the first main pipe and another end of each one of the first branch pipes communicating with a respective one of the first bendable tubes; and the outlet portion of the heat exchanger further comprises:

two second branch pipes; one end of each one of the second branch pipes communicating with the second main pipe and another end of each one of the second branch pipes communicating with a respective one of the second bendable tubes.

6. The gravity loop thermosyphon as claimed in claim 4, wherein:

the inlet portion of the heat exchanger further comprises:

two first branch pipes; one end of each one of the first branch pipes communicating with the first main pipe and another end of each one of the first branch pipes communicating with a respective one of the first bendable tubes; and the outlet portion of the heat exchanger further comprises:

two second branch pipes; one end of each one of the second branch pipes communicating with the second main pipe and another end of each one of the second branch pipes communicating with a respective one of the second bendable tubes.

7. The gravity loop thermosyphon as claimed in claim 1, wherein each one of the at least one first bendable tube and the at least one second bendable tube is a metal hose.

8. The gravity loop thermosyphon as claimed in claim 6, wherein each one of the at least one first bendable tube and the at least one second bendable tube is a metal hose.

9. A heat dissipation device comprising:

a frame assembly;

the gravity loop thermosyphon as claimed in claim 1 securely mounted on the frame assembly;

at least one dissipating fin assembly abutting the at least one condenser of the gravity loop thermosyphon; the at least one dissipating fin assembly fixed on the gravity loop thermosyphon via the frame assembly.

10. The heat dissipation device as claimed in claim 9, wherein the frame assembly comprises:

a base; the heat exchanger of the gravity loop thermosyphon mounted on the base;

two arms respectively and securely mounted on two ends of the base and the two arms located at two lateral sides of the gravity loop thermosyphon; and at least one abutting component; two ends of each one of the at least one abutting component respectively connected to the two arms; the at least one abutting component pressing the at least one dissipating fin assembly.

11. The heat dissipation device as claimed in claim 10, wherein:

the two ends of each one of the at least one abutting component are respectively and tiltably mounted on the two arms, thereby selectively pressing the at least one dissipating fin assembly; and the frame assembly further comprises:

a plurality of resilient components; one end of each one of the resilient components connected to one of the arms and another end of each one of the resilient components connected to one end of one of the at least one abutting component, thereby tilting said abutting component away from the at least one dissipating fin assembly; and a plurality of fixing components; each one of the fixing components securely mounted on one of the arms; each one of the fixing components clamping said one of the at least one abutting component with the corresponding arm, thereby preventing said abutting component from tilting away from the at least one dissipating fin assembly.

12. The heat dissipation device as claimed in claim 9, wherein each one of the at least one dissipating fin assembly comprises:

a first fin assembly; and a second fin assembly; the first fin assembly and the second fin assembly respectively mounted to two sides of one of the at least one condenser and clamping said condenser.

13. The heat dissipation device as claimed in claim 11, wherein each one of the at least one dissipating fin assembly comprises: a first fin assembly; and a second fin assembly; the first fin assembly and the second fin assembly respectively mounted to two sides of one of the at least one condenser and clamping said condenser.

* * * * *